(12) United States Patent
Vaganova et al.

(10) Patent No.: US 9,306,168 B2
(45) Date of Patent: Apr. 5, 2016

(54) POLYMERIC COMPOSITIONS AND USES THEREOF

(75) Inventors: Evgenia Vaganova, Jerusalem (IL); Shlomo Yitzchaik, Jerusalem (IL)

(73) Assignee: Yissum Research Development Company of the Hebrew University of Jerusalem Ltd., Jerusalem (IL)

( * ) Notice: Subject to any disclaimer, the term of this patent is extended or adjusted under 35 U.S.C. 154(b) by 30 days.

(21) Appl. No.: 14/004,801

(22) PCT Filed: Jun. 21, 2012

(86) PCT No.: PCT/IL2012/050212
§ 371 (c)(1),
(2), (4) Date: Sep. 12, 2013

(87) PCT Pub. No.: WO2012/176204
PCT Pub. Date: Dec. 27, 2012

(65) Prior Publication Data
US 2014/0001410 A1  Jan. 2, 2014

Related U.S. Application Data

(60) Provisional application No. 61/500,292, filed on Jun. 23, 2011.

(51) Int. Cl.
| | |
|---|---|
| H01B 1/00 | (2006.01) |
| H01L 51/00 | (2006.01) |
| C08L 39/08 | (2006.01) |
| C08L 33/10 | (2006.01) |
| H01B 1/12 | (2006.01) |
| H01L 51/42 | (2006.01) |

(52) U.S. Cl.
CPC .............. *H01L 51/0035* (2013.01); *C08L 33/10* (2013.01); *C08L 39/08* (2013.01); *H01B 1/128* (2013.01); *H01B 1/124* (2013.01); *H01L 51/42* (2013.01); *Y02E 10/549* (2013.01)

(58) Field of Classification Search
CPC .................................. H01B 3/44; H01B 1/124
USPC .......................................................... 252/500
See application file for complete search history.

(56) References Cited

U.S. PATENT DOCUMENTS

| | | | | |
|---|---|---|---|---|
| 4,959,162 A | * | 9/1990 | Armes et al. ............. | 252/519.34 |
| 2011/0143448 A1 | * | 6/2011 | Serban et al. ................ | 436/122 |

FOREIGN PATENT DOCUMENTS

WO    03/021695 A1    3/2003

OTHER PUBLICATIONS

Becke, "A multicenter numerical integration scheme for polyatomic molecules", J. Chem. Phys., vol. 88, No. 4, pp. 2547-2553, (1988).
Berestetsky, et al., "Photoactive Proton Conductor: Poly(4-vinyl pyridine) Gel", J. Phys. Chem. B., vol. 112, pp. 3662-3667, (2008).
(Continued)

*Primary Examiner* — Harold Pyon
*Assistant Examiner* — William Young
(74) *Attorney, Agent, or Firm* — Vorys, Sater, Seymour & Pease LLP

(57) ABSTRACT

Provided are thermo-sensitive and light-sensitive polymer compositions including poly(4-vinyl pyridine) and poly(4-vinyl pyridine-co-butyl methacrylate).

19 Claims, 18 Drawing Sheets

(56) References Cited

OTHER PUBLICATIONS

Delley, "Ground-State Enthalpies: Evaluation of Electronic Structure Approaches with Emphasis on the Density Functional Method", J. Phys. Chem. A., vol. 110, pp. 13632-13639, (2006).
Ikeura, et al., "Molecular Recognition at the Air-Water Interface. Specific Binding of Nitrogen Aromatics and Amino Acids by Monolayers of Long-Chain Derivatives of Kemp's Acid", J. Am. Chem. Soc., vol. 113, pp. 7342-7350, (1991).
Ilten, et al., "Correlations between Photoinduced EPR and Photoconductivity in TCNE-THF Solution Charge-Transfer Complex", The Journal of Chemical Physics, vol. 42, pp. 3760-3766, (1965).
International Search Report for International Application No. PCT/IL2012/050212, two pages, mailed Sep. 27, 2012.
Khalig, "Investigation of the catalytic activity of poly(4-vinylpyridine) supported iodine as a new, efficient and recoverable catalyst for regioselective ring opening of epoxides", RSC Adv. vol. 2, pp. 3321-3327, (2012).
Martin, et al., "Picosecond Laser Photolysis Studies of Deactivation Processes of Excited Hydrogen-Bonding Complexes. 2. Dibenzocarbazole-Pyridine Systems", J. Phys. Chem., vol. 86, pp. 4148-4156, (1982).
Miescher, "Absorption Spectrum of the NO Molecule, Part VII. Extension of the Rydberg series of ns, np, nd, and nf . . . complexes", Journal of Molecular Spectroscopy, vol. 20, pp. 130-140, (1966).
Moffatt, et al., "Metal oxide-polymer thermistors", Journal of Materials Science, vol. 24, pp. 609-614, (1989).
Perdew, et al., "Accurate and simple density functional for the electronic exchange energy: Generalized gradient approximation", Physical Review B., vol. 33, No. 12, pp. 8800-8802, (1986).
Perdew, et al., "Generalized Gradient Approximation Made Simple", Physical Review Letters, vol. 77, No. 18, pp. 3865-3868, (1996).
Rozenberg, et al., "FTIR study of self-protonation and gel formation in pyridinic solutions of poly(4-vinylpyridine)", New J. Chem., vol. 24, pp. 109-111, (2000).
Vaganova, et al., "Modelling of poly(4-vinyl pyridine) and poly(4-vinyl pyridine)/pyridine composites: structural and optical properties", Molecular Simulation, vol. 34, Nos. 10-15, pp. 981-987, (2008).
Vaganova, et al., "Photoinduced Proton Transfer in a Pyridine Based Polymer Gel", J. Phys. Chem. B., vol. 114, pp. 10728-10733, (2010).
Varshney, et al., "Anionic Homopolymerization and Block Copolymerization of 4-Vinylpyridine and Its Investigation by High-Temperature Size-Exclusion Chromatography in N-Methyl-2-pyrrolidinone", Macromolecules, vol. 26, pp. 701-706, (1993).
Williams, et al., "Photoinduced Electron Spin Resonance Signals in Acid-Doped Poly(N-vinylcarbazole)-Nitroaromatic Charge Transfer Complexes", Journal of the American Chemical Society, vol. 94, No. 23, pp. 7970-7975, (1972).

* cited by examiner

POLYMERIC COMPOSITIONS AND USES THEREOF

TECHNOLOGICAL FIELD

This invention relates to thermo-sensitive and light-sensitive polymers.

BACKGROUND

The development of optoelectronic devices using organic and/or polymeric molecules is one of the most significant challenges of 21$^{st}$ century electronics [1,2]. Such devices would be inexpensive, easy to handle and, at the same time, would permit size flexibility in a wide scale. The wavelength range of sensitivity of these devices is currently the subject of extensive study. On the other hand, thermo-sensitive organic materials, serving as the active component of thermistors, have also been introduced [3].

Similarly, the development of organic photovoltaic cells is a field which holds much promise of future practical application. The idea of producing photoconductive systems by direct irradiation at the charge-transfer absorption band of donor/acceptor organic molecules has been under discussion since the early 1960's. One of the first systems studied was a photoconductive charge-transfer (CT) complex of tetracyanoethylene (TCE) in tetrahydrofuran (THF) [1]. The conductivity of the system was found to be due to the dissociation of the charge-transfer triplet state of the TCE/THF complex. A few years later, a polymer complex: poly(N-vinylcarbazole) and o-dinitrobenzene in the presence of a strong Brønsted acid (trichloroacetic acid), was also shown to be photoconductive [2]. The formation of the conductive states occurred via a bimolecular reaction between an excited state of the carbazole-nitroaromatic charge transfer complex and a proton.

Recently, an effective photoconductive polymeric gel, based on the pyridine molecule, i.e. poly(4-vinyl pyridine (P(4VP)) in liquid pyridine (Py), molar ratio 1:1, was described [4]. The P(4VP)/Py gel is basic with a pH of 9.1. Photoconductivity was observed in the gel under irradiation at 385 nm at the proton transfer center N$^+$H, which formed on the polymer side chain. The conductivity was explained as being due to the proton mobility in the excited state and to the conjugated structure of the protonated species [5,6]. The changes in conductivity are proportional to the square root of the light intensity with deviation in the high and low intensity range. The deviation in the low intensity range was associated to the activation energy of the process and in the high intensity range, to the limited concentration of the proton transfer centers.

REFERENCES

[1] D. F. Ilten, and M. Calin, *J. Chem. Phys.* 1965, v. 42, pp. 3760.
[2] D. J. Williams, M. Abkovitz, M. and G. Pfister, *JACS*, 1972, v. 94, pp. 7970.
[3] D. M. Moffat, J. P. Runt, A. Halliyal, R. E. Newnham, *J. Mat. Sci.* 1989, v. 24, pp. 609.
[4] N. Berestetsky, E. Vaganova, E. Wachtel, G. Leitus, A. Goldberg, and S. Yitzchaik, *J. Phys. Chem. B,* 2008, v. 112, pp. 3662.
[5] E. Vaganova, E. Wachtel, G. Leitus, D. Danovich, S. Lesnichin, J. Shenderovich, H.-H. Limbach, S. Yitzchaik, *J. Phys. Chem. B,* 2010, v. 114, pp. 10728.
[6] E. Vaganova, N. Berestetsky, S. Yitzchaik, A. Goldberg, *Molecular Simulation,* 2008, v. 34, pp. 981.
[7] J. P. Perdew, K. Burke, M. Ernzerhof, *Phys. Rev. Lett.,* 1996, v. 77, pp. 3865.
[8] J. P. Perdew, Y. Wang, *Phys. Rev. B.,* 1986, v. 33, pp. 8800.
[9] B. Delly, *J. Phys. Chem. A,* 2006, v. 110, pp. 13632.
[10] A. D. Becke, *J. Chem. Phys.* 1988, v. 88, pp. 2547.
[11] E. Miercher, *J. Mol. Spectr.* 1966, v. 20, pp. 130.
[12] M. M. Martin, N. Ikeda, T. Okada, and N. Mataga, *J. Phys. Chem.* 1982, v. 86, pp. 4148.
[13] N. G. Khalig, *RCS Advances,* 2012, v. 2, pp. 3321.
[14] M. Rozenberg, E. Vaganova, S. Yitchaik, *New J. Chem.,* 2000, 24, 109.
[15] Y. Ikeura, K. Kurihara, T. Kunitake, *JACS,* 1991, v. 113, pp. 7342. 450, pp. 302.

SUMMARY OF THE INVENTION

The invention relates to a combination comprising poly(4-vinyl pyridine) and poly(4-vinyl pyridine-co-butyl methacrylate).

Poly(4-vinyl pyridine) has a repeating moiety of the general formulae (A):

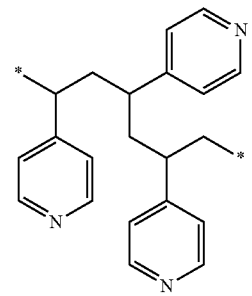

(A)

Poly(4-vinyl pyridine-co-butyl methacrylate) is a "copolymer", i.e. a polymer which is constituted of two or more polymeric repeating units, in this case poly(4-vinyl pyridine) and poly(butyl methacrylate), and has a repeating moiety of the general formula (B):

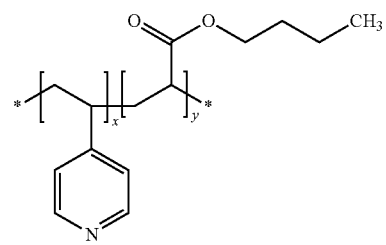

(B)

wherein x may be between 0 and 5,000; and y may be between 0 and 500.

The polymers used in accordance with the invention may be homopolymers, copolymers, such as for example, block, graft, random and alternating copolymers as well as terpolymers, further including their derivatives, combinations and blends, and may further be of any geometrical configuration including linear, block, graft, random, alternating, branched structures, and combination thereof.

Poly(4-vinyl pyridine-co-butyl methacrylate) is typically a block copolymer, formed of two or more homo-polymer subunits (blocks) linearly linked by chemical bonds (i.e. the blocks are connected end-to-end). Poly(4-vinyl pyridine-co-butyl methacrylate) may also be a graft copolymer, wherein the poly(4-vinyl pyridine) constitutes the main polymeric chain, while the butyl methacrylate moieties are attached to the main structure as side chains.

According to the present invention, the two polymers are combined, or present in "combination", namely they are in a mixture or a blend in the form of a homogenous mass. In some embodiments, the combination of poly(4-vinyl pyridine) and poly(4-vinyl pyridine-co-butyl methacrylate) is in the form of a "gel", namely a solid-like three-dimensional network held together by physical and/or chemical associations. Such association may be, inter alia, hydrogen bonding, ionic associations, dipole-dipole associations, van der Waals associations, etc.

The combination of the invention may further comprise, by some embodiments, a solvent or a liquid medium which enables the formation and stabilization of a gel state. In some embodiments, the liquid medium is an organic liquid, such as pyridine, which may be in an anhydrous form. In such embodiments, the poly(4-vinyl pyridine) and poly(4-vinyl pyridine-co-butyl methacrylate) may form a gel with the pyridine, entrapping molecules of pyridine within said three-dimensional network.

The invention also contemplates a composition comprising poly(4-vinyl pyridine), poly(4-vinyl pyridine-co-butyl methacrylate) and pyridine.

In some embodiments, the poly(4-vinyl pyridine) is associated with the poly(4-vinyl pyridine-co-butyl methacrylate) through the above-mentioned associations, i.e., the poly(4-vinyl pyridine) and poly(4-vinyl pyridine-co-butyl methacrylate) may be associated via one or more interactions selected from hydrogen bonding, ionic bonding and dipole-dipole interaction. In some embodiments, at least a part of said associations is reversible, namely the association may be non-permanent, or form and deteriorate depending on an external stimuli, such as irradiation of light or changes in the thermal conditions.

In some embodiments, the poly(4-vinyl pyridine-co-butyl methacrylate) has 1% butyl methacrylate side chains, namely in the structure formula (B) above, x being equal to 0.01.

In some embodiments, the weight ratio of poly(4-vinyl pyridine) to poly(4-vinyl pyridine-co-butyl methacrylate) is between 90:10 and 50:50. In other words, the compositions may comprise different ratios of the polymers (by weight), being between 90 parts of poly(4-vinyl pyridine) and 10 parts poly(4-vinyl pyridine-co-butyl methacrylate) (namely 90:10), to 50 parts of poly(4-vinyl pyridine) and 50 parts poly(4-vinyl pyridine-co-butyl methacrylate) (namely 50:50). Thus, in some embodiments, the weight ratio of poly(4-vinyl pyridine) to poly(4-vinyl pyridine-co-butyl methacrylate) may be 90:10, 80:20, 70:30, 60:40 or 50:50.

In other embodiments, the weight ratio is between 20:80 and 50:50.

In some other embodiments, the weight ratio is 20:80.

According to some embodiments, the composition comprises 50% pyridine and 50% of poly(4-vinyl pyridine) and poly(4-vinyl pyridine-co-butyl methacrylate), combined.

In some embodiments, the molecular weight of the poly(4-vinyl pyridine) is between 1,000 and 500,000 g/mole. In other embodiments, the molecular weight of poly(4-vinyl pyridine) is between 10,000 and 100,000 g/mole In some other embodiments, the molecular weight of the poly(4-vinyl pyridine-co-butyl methacrylate) is between 5,000 and 500,000 g/mole. In further embodiments, the molecular weight of the poly(4-vinyl pyridine-co-butyl methacrylate) is between 100,000 and 400,000 g/mole.

According to some embodiments, the poly(4-vinyl pyridine) and poly(4-vinyl pyridine-co-butyl methacrylate) are swollen with pyridine, i.e., the polymers increase in volume as a result of absorption of an organic solvent, in this case pyridine, thereby forming a three-dimensional structure of a polymeric scaffold, entrapping pyridine within the pores of said scaffold.

In some embodiments, the composition of poly(4-vinyl pyridine) and poly(4-vinyl pyridine-co-butyl methacrylate), with or without pyridine, is in the form of a gel.

The compositions of the invention may further comprise 4-hydroxypyridine. In such embodiments, the 4-hydroxypyridine may be at a concentration of between 0 and 50 wt. %. In some embodiments, the 4-hydroxypyridine may be at a concentration of between 0.001 and 20 wt. %. In other embodiments, the 4-hydroxypyridine may be at a concentration of between 0.001 and 10 wt. %. In some other embodiments, the 4-hydroxypyridine may be at a concentration of between 0.001 and 5 wt. %. In further embodiments, the 4-hydroxypyridine may be at a concentration of between 0.001 and 1 wt. %. In yet further embodiments, the 4-hydroxypyridine may be at a concentration of between 0.001 and 0.5 wt. %.

According to some embodiments, the composition has an electrical conductivity of at least $10^{-8}$ S/cm (i.e. Siemens/cm) or an electrical resistance of at most 15 MΩ.

The compositions of the invention are regarded as "photo-sensitive materials", namely the electrical conductivity of the composition changes with exposure to light (i.e., a flux of photons, e.g., between the wavelengths of 254 nm and 14,000 nm), mainly due to excitation, transfer and mobility of charge-carrier species (protons and electrons). Such photo-sensitivity may also be due to the formation or deterioration of physical and/or chemical bonds formed between molecules of poly(4-vinyl pyridine), or between molecules of poly(4-vinyl pyridine) and molecules of poly(4-vinyl pyridine-co-butyl methacrylate). The photo-sensitive materials, or compositions, show change in conductivity due to the exposure to light in the entire visible spectrum, namely, between the wavelengths of 400 nm and 750 nm, and typically to white light, encompassing all wavelengths of the visible spectrum.

According to some embodiments, the photo-sensitive material has an electrical conductivity of at most $10^{-8}$ S/cm. In other embodiments, the electrical conductivity of photo-sensitive material is at least $10^{-3}$ S/cm during exposure to light (i.e. light irradiation).

The compositions of the invention may alternatively or additionally be regarded as "thermo-sensitive materials", which change their properties when exposed to changes in temperature. In particular, the thermo-sensitive materials (or compositions) of the invention show an increase or decrease in electrical resistance due to changes in the temperature, e.g., ambient temperature in which the materials are placed. The degree of change in temperature will be denoted as "thermal exposure intensity".

In some embodiments, the electrical resistance of the composition is at most 15 MΩ. In other embodiments the electrical resistance is between 1 kΩ and 15 MΩ.

Upon change in the thermal exposure intensity, the electrical resistance is at least 5 MΩ. In such embodiments, the change in the thermal intensity may be controlled to an accuracy of at least 0.01° C.

In some embodiments, the compositions of the invention are photo-sensitive. In other embodiments, the compositions of the invention are thermo-sensitive. According to some other embodiments, the compositions of the invention are both photo-sensitive and thermo-sensitive.

In another aspect, the combinations or compositions of the invention are used as photo-sensitive and/or thermo-sensitive materials.

Therefore, it is an object of the invention to provide a photo-sensitive material comprising poly(4-vinyl pyridine) and poly(4-vinyl pyridine-co-butyl methacrylate), and optionally further comprising pyridine and/or 4-hydroxypyridine, as herein described.

It is another object of the invention to provide a thermo-sensitive material comprising poly(4-vinyl pyridine) and poly (4-vinyl pyridine-co-butyl methacrylate), and optionally further comprising pyridine and/or 4-hydroxypyridine, as herein described.

In some embodiments, the photo-sensitive and/or thermo-sensitive material further comprises pyridine. In such embodiments, the pyridine may be anhydrous pyridine.

In other embodiments, the photo-sensitive and/or thermo-sensitive material is in the form of a gel.

In some other embodiments, the photo-sensitive and/or thermo-sensitive material of the invention comprise poly(4-vinyl pyridine-co-butyl methacrylate) having 1% butyl methacrylate side chains.

In further embodiments, in the photo-sensitive and/or thermo-sensitive material of the invention, the weight ratio of poly(4-vinyl pyridine) to poly(4-vinyl pyridine-co-butyl methacrylate) is between 90:10 and 50:50.

According to some embodiments, the photo-sensitive and/or thermo-sensitive material comprises 50% pyridine and 50% of poly(4-vinyl pyridine) and poly(4-vinyl pyridine-co-butyl methacrylate), combined.

According to other embodiments, the molecular weight of the poly(4-vinyl pyridine) employed in the photo-sensitive and/or thermo-sensitive material of the invention is between 40,000 and 60,000 g/mole and/or the molecular weight of the poly(4-vinyl pyridine-co-butyl methacrylate) is between 300,000 and 350,000 g/mole.

According to some other embodiments, photo-sensitive and/or thermo-sensitive material has an electrical conductivity of at most $10^{-8}$ S/cm or an electrical resistance of at most 15 MΩ. In other embodiments, the electrical resistance is between 1 kΩ and 15 MΩ.

According to some embodiments, when the composition/gel of the invention is used in a device having plastic electrodes, as further detailed below, the electrical resistance is measured at between 5 kΩ and 15 MΩ. Similarly, when quartz electrodes are utilized, an electrical resistance of between 5 MΩ and 15 MΩ is measured.

In some embodiments, the electrical conductivity of photo-sensitive and/or thermo-sensitive material is at least $10^{-3}$ S/cm during exposure to light; said light has a wavelength of between 400 nm and 750 nm. In some embodiments, the light is white light.

In some other embodiments, the electrical resistance of the photo-sensitive and/or thermo-sensitive material of the invention is at least 1 kΩ upon change in thermal exposure intensity. In such embodiments, the change in thermal intensity is of a magnitude of at least 1%.

In some implementations of the invention, the thermo- and light-sensitive composition or gel is allowed to calibrate (pre-treatment) under exposure to an electrical DC field to permit charge separation of ionic species that may be present in the composition or gel. The field may be applied for a period of time sufficient to achieve such calibration; the period of time being, in some embodiments, between 5 and 30 minutes, at a voltage of at most 5 V. A DC bias may also be applied during the consecutive use of the composition/gel. In such implementations, a constant bias of about 0.5 V may be applied.

In another aspect, the invention provides a device, or product, comprising the combinations, compositions, photo-sensitive materials and/or thermo-sensitive materials as herein described. In some embodiments, the product may be selected from a photo-responsive panel, a photovoltaic cell, a photo-responsive sensor, a thermo-responsive sensor, a thermal resistor, a thermo-responsive panel, a liquid display panel, a thermal imaging device and external controlled capacitor.

In some embodiments, the device is a thermo-sensitive sensor or a photo-responsive sensor.

In other embodiments, the device is a thermo-responsive panel.

In other embodiments, the product has at least one flexible or foldable element said element being composed or comprises a material according to the invention.

In further embodiments, the composition is encapsulated within a shell, the shell being impermeable to pyridine, as to prevent evaporation of the pyridine from the composition (in the cases where the compositions comprise pyridine).

In another aspect, the invention provides the use of the combinations, compositions, photo-sensitive materials, and/or thermo-sensitive materials as herein described, in the manufacture of a product selected from a photo-responsive panel, a photovoltaic cell, a photo-responsive sensor, a thermo-responsive sensor, a thermal resistor, a thermo-responsive panel, a liquid display panel, a thermal imaging device and externally controlled capacitor.

In some embodiments, the device of the invention is a sensor or a device comprising a sensor. The sensors comprising the photo-sensitive and/or thermo-sensitive materials of the invention may also comprise at least one electrode or electrodes array or assembly and wiring, all being optionally housed in a protective casing.

In some embodiments, the device is a thermo-sensitive sensor for use in, e.g., a thermal imaging device. Such a thermal imaging device may be, for example, a night-vision device. The device may comprise a sensor having at least one surface associated with a thermo-sensitive material of the invention, as well as an image intensifying element, e.g., a tube, and optionally one or more of: a telescopic lens and an IR illuminator, the sensor being optionally housed within a protective casing.

In other embodiments, the device is a photo-responsive sensor, or a photo-detector, which may be a charged-coupled device (CCD), a photoresistor, a photovoltaic cell, a photomultiplier, a phototransistor, etc.

According to some other embodiments, the device may be a thermo-responsive panel, for use as a touch-screen, in which the thermo-sensitive material of the invention is applied as a layer of material beneath a top layer of a user-interface screen, thereby providing a panel which responds to local changes in temperature resulting from heat transfer between the finger of the user and the thermo-sensitive material.

Another aspect of the invention provides a process for preparing the combinations, compositions, photo-sensitive materials and/or thermo-sensitive materials, as herein described, the process comprising:
(a) mixing poly(4-vinyl pyridine) and poly(4-vinyl pyridine-co-butyl methacrylate) to provide a polymer mixture; and
(b) optionally adding pyridine to the polymer mixture, e.g., while mixing.

In some embodiments, the process further comprises a step of adding 4-hydroxypyridine. In such embodiments, the 4-hydroxypyridine may be added either to the polymer mixture prior to adding the pyridine, or together with the pyridine, or subsequent the addition of pyridine.

In other embodiments, the process further comprises drying the (4-vinyl pyridine) and poly(4-vinyl pyridine-co-butyl methacrylate) prior to mixing.

In another aspect, the invention provides a process for preparing the combinations, compositions, photo-sensitive materials, or thermo-sensitive materials as described herein, the process comprising:

mixing poly(4-vinyl pyridine) with pyridine to provide a mixture; and introducing (e.g., while mixing) poly(4-vinyl pyridine-co-butyl methacrylate) into said mixture.

In some embodiments, the process further comprises a step of adding 4-hydroxypyridine. In such embodiments, the 4-hydroxypyridine is added either to the first mixture, or to the mixture formed after the introduction of poly(4-vinyl pyridine-co-butyl methacrylate), or during the mixing of the first mixture with poly(4-vinyl pyridine-co-butyl methacrylate), or subsequent to the mixing of the first mixture with poly(4-vinyl pyridine-co-butyl methacrylate).

In other embodiments, the process further comprises drying the (4-vinyl pyridine) and poly(4-vinyl pyridine-co-butyl methacrylate) prior to mixing.

Another aspect of the invention provides a composition obtained by the process as described herein.

In another aspect, the invention provides a composition obtainable by the process as described herein.

In another aspect of the present invention, there is provided a device comprising at least one element of a material prepared according to the present invention.

BRIEF DESCRIPTION OF THE DRAWINGS

In order to understand the disclosure and to see how it may be carried out in practice, embodiments will now be described, by way of non-limiting example only, with reference to the accompanying drawings, in which.

DETAILED DESCRIPTION OF EMBODIMENTS

Figure 1:
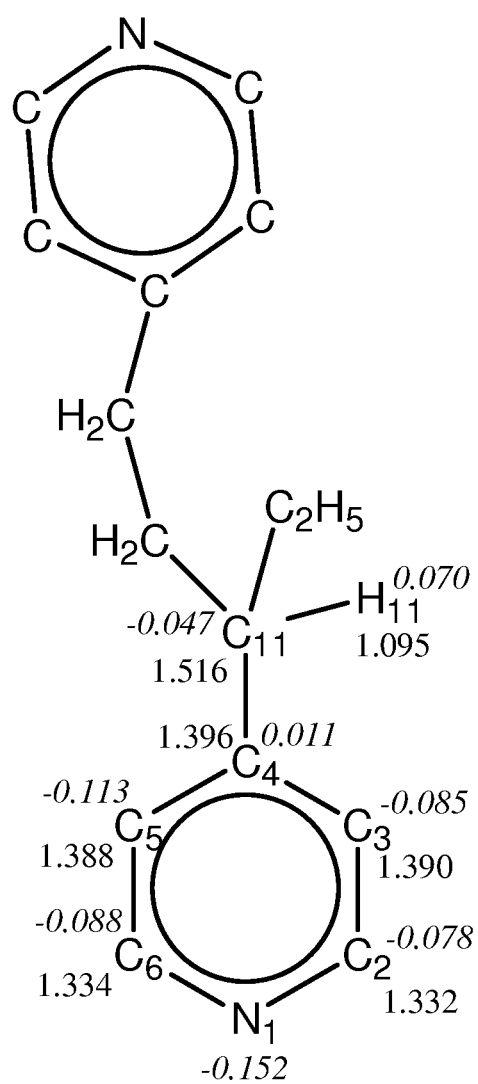
FIG. 1 shows the DFT-optimized lengths (Å) and Mulliken charge distributions (in electrons) for the side-chain atoms of P4VP/Py. The net charge of the molecule is zero.

In order to expand the spectral range of photosensitivity, P(4VP)/Py gel were prepared with different types of electron transfer centers, in addition to the proton transfer centers existing therein. Here, polymer gels containing two polymers: poly(4-vinyl pyridine) and poly(4-vinyl pyridine-co-butyl methacrylate) swollen in pyridine were examined.

In the first method, the gel was prepared from the polymer blend and in the second—a complex gel was prepared by mixing two preformed gels, one of each polymer.

EXPERIMENTAL

Materials

Poly(4-vinyl pyridine) with a molecular weight of 50,000 (Polyscience, Inc.) was carefully dried in a vacuum oven ($10^{-3}$ torr) at 25° C. during 3-4 weeks prior to use. The pyridine (Py) was anhydrous. Poly(4-vinylpyridine-co-butyl methacrylate), (P(4VP-BMA), Aldrich) with a molecular weight of 337,000 and 1-5% butyl methacrylate side chains, was used as received. For some samples, a small amount of 4-hydroxypyridine (Sigma) was added to the polymer blend.

Preparation of the Polymer Blend

The P(4VP-BMA) gel was prepared by mixing the polymer with an equal weight of pyridine (I). The polymer blend was prepared by mixing P(4VP-BMA) with P(4VP) at a weight ratio of 20:80 (II) or 50:50 (III). In addition, in some experiments a gel formed from the polymer blend in which the P4VP/P(4VP-BMA) weight ratio was 90:10 (IV). The mixture of polymers (P4VP/P(4VP-BMA)) was dissolved in an equal weight of liquid pyridine.

For the complex gel preparation (V) equal weights of the P4VP/Py and P(4VP-BMA) gels were separately placed on the electrode conductive surface. Then the two electrodes were manually pressed together, thereby forming a single layer of gel.

For some samples, a small amount of 4-hydroxypyridine was added.

The sample was stored in the dark for a period of weeks. All procedures involving the initial viscous solution and gel preparation were accomplished in a glove-box under nitrogen atmosphere. The gelation of the viscous solution occurs spontaneously and its progress was evaluated visually.

Electrical Conductivity Measurement

For the electrical conductivity measurements, a 100-300 µm thick film of polymer gel, prepared as described above, was sandwiched between glass/ITO (SPI, Inc., 30-60 ohm) or ITO (Indium Tin Oxide) covered plastic sheets (produced in the HUJI Nanocenter). The area of the gel was 1 $cm^2$. Photoinduced or thermally induced conductivity changes were measured with a multimeter (197 autoranging microvolt DVM, Keithley) which was also used as a source of DC bias. Bias was applied for at least 0.5 hr prior to measurement. For the photoconductivity measurements, white light of different intensities was produced with a hand flash (KT-2.2V, 0.47 A). Chopping was achieved with a manual shutter. The intensity of the light was measured with power meter PM100D (THORLABS). Different temperature controlled cells were used: S.C.T.-cell (Shimadzu), TCC-controller (Shimadzu), tempcontrol 37 (Zeiss), depending on the type of measurement that was made. For all measurements, the room temperature was stabilized at 22.5±0.1° C.

Spectroscopy

Absorption spectra were recorded with a UV-5301PC spectrophotometer (Shimadzu). Excitation and photoluminescence spectra were measured on a Shimadzu RF-5301PC spectrofluorimeter; collection was at right angles to the excitation beam. The resolution of the emission and excitation spectra was 1 nm; the resolution of the absorption spectra was 2 nm. Samples of the gel were placed between ITO covered glass slides (SPI, Inc.; Kintec Company) or between quartz slides (Chemglass, USA). The applied bias was 3.7V. The temperature of observation was stabilized at 22.5±0.1° C. FTIR spectra of free standing films were measured using the Tensor Σ7 unit (Pike technologies). Each measurement was repeated three times from different areas of the film.

Modeling

DFT modeling of the pyridine and butyl methacrylate side-chain moieties was performed with the density functional theory (DFT) code DMo1 [6] that uses the numerical basis sets as implemented in Materials Studio 5.5 provided by Accelrys [6]. A double numerical polarized (DNP) basis set was employed that includes all occupied atomic orbitals, in addition to a second set of valence atomic orbitals, polarized d-valence orbitals, and a p-orbital on the hydrogen atoms. The Perdew-Burke-Ernzerhof (PBE) gradient corrected functional, that depends on the electron density and its derivative, was applied [7]. This functional, based on the Perdew model to correct the local-density approximation [8], provides a correction which leaves only 1% error in the exchange energy. It was shown by Delley [9] that the PBE functional with the DNP numerical basis set gives enthalpies of formation for a large set of tested compounds and molecules from National Institute of Standard and Technology (NIST) closer to experimental values than that obtained with the hybrid B3LYP/6-31G** functional [10]. The spin unrestricted approach was applied with all electrons being considered explicitly.

Results

Properties of (P4VP)/Py Gel

The conductivity of the P4VP/Py gel alone is $10^{-7}$ S/cm and two types of charge carriers are responsible for the photocurrent with electron mobility of 0.1 $cm^2V^{-1} s^{-1}$ and proton mobility of $1.8 \times 10^{-3}$ $cm^2V^{-1} s^{-1}$. FTIR spectroscopy identified the CH group of the polymer main chain as the origin of the protons. As these data proposed an acidic character for the main chain CH, DFT modeling was applied to evaluate the charge distribution on the atoms of the polymeric main chain. The modeling (FIG. 1) shows that the carbon on the polymer main chain, namely $C_{11}$ has a small negative charge −0.047 e.s.u. The acidity of the polymeric CH group stimulates the proton donating properties. The ground electronic state is singlet with adiabatic singlet-triplet excitation energy equal to 84.73 kcal/mol for the polymer side-chain. In the photo-excited state, the acidic properties of the main chain CH group assist in the transfer of the proton from the CH group to the pyridine nitrogen. In the presence of a DC electric field (>1 kV), the charge separated system appears to form a well-defined, ordered structure. HRTEM (high resolution transmitting electron microscopy) examination of the gel which has been kept under DC field and dried under vacuum in a TEM chamber showed a regular striated pattern (not shown).

Properties of P(4VP-BMA)/Py Gel (I)

Figure 2A:
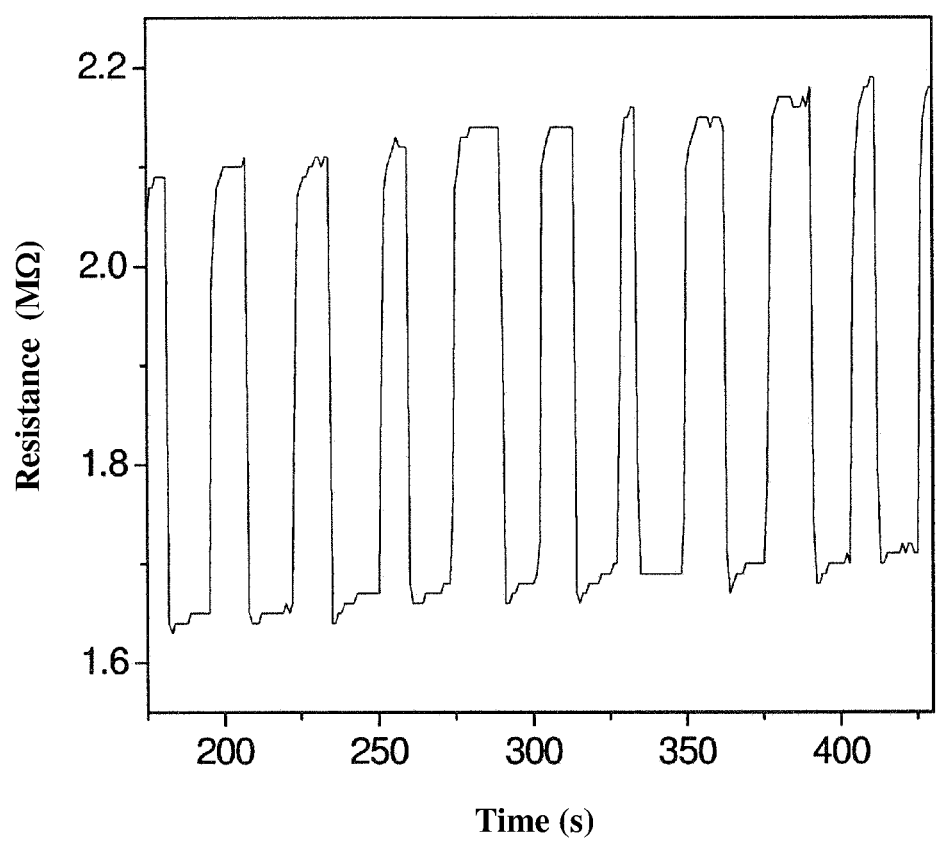
FIG. 2A shows the periodic resistance changes of a 100 μm thick film of the P(4VP-BMA)/Py gel (area 1 cm$^2$) placed between two glass/ITO electrodes. Irradiation at 700 nm was accomplished with a 6.7 mW/cm$^2$ Xe lamp. Light chopping was achieved with a manual shutter. The internal DC electric filed exceeded 1 kV/cm. The temperature of the observation was stabilized at 22.5±0.1° C.
Figure 2B:
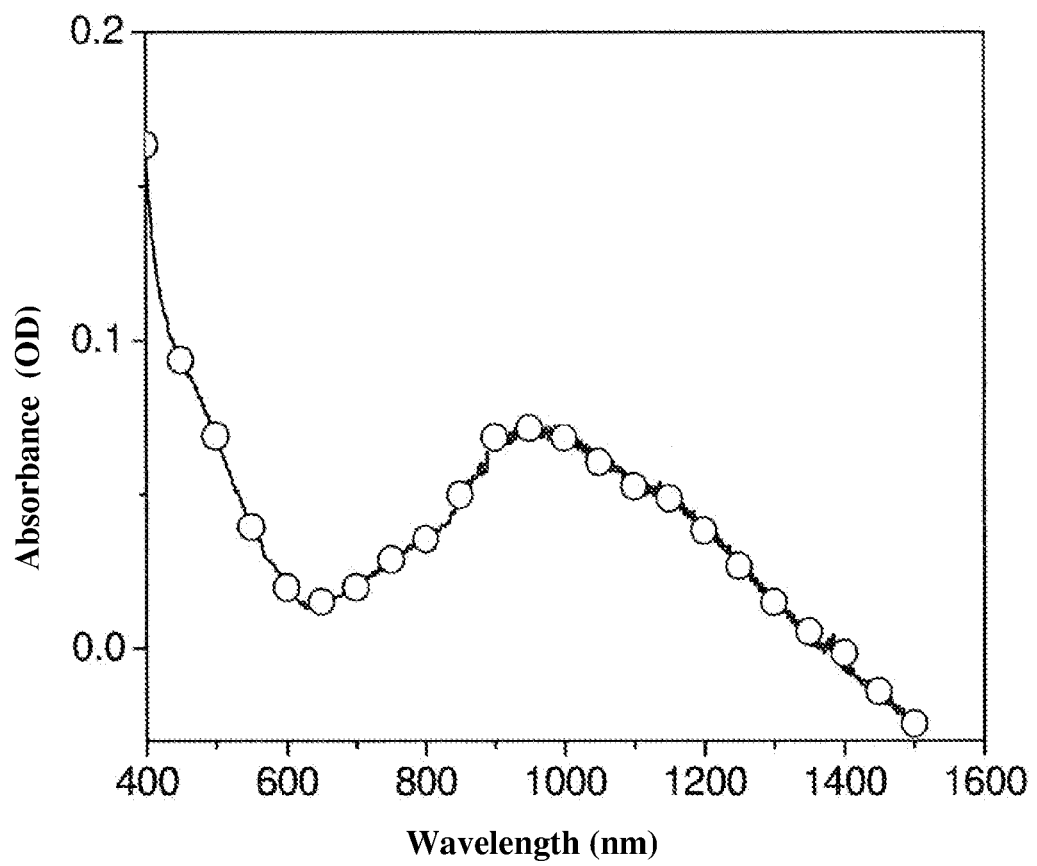
FIG. 2B shows the absorption spectrum of the film of FIG. 2A after being kept in the DC field during two hours, compared to a non-treated gel shown in FIG. 2C.
Figure 2C:
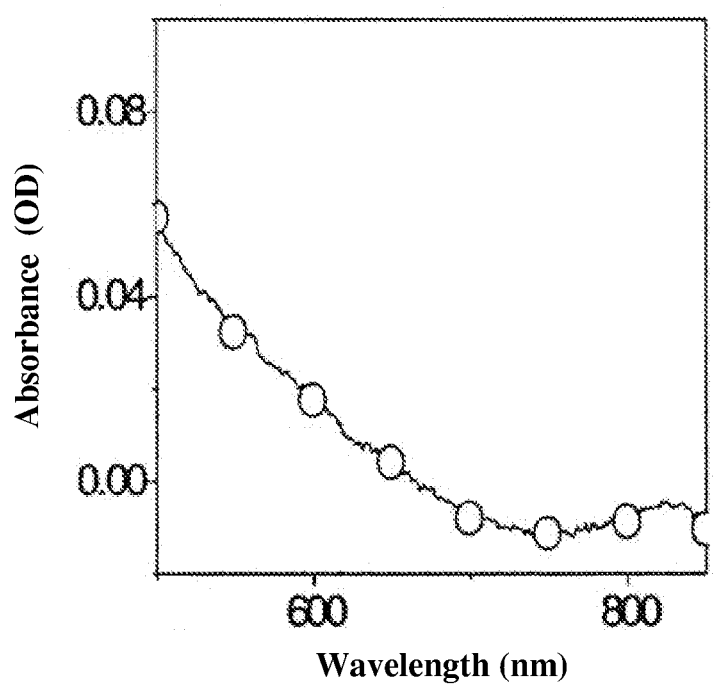

The P(4VP-BMA)/Py gel is acidic (pH 5.7) and displays photosensitivity in the far red wavelength range (700-800 nm) as compared to practically negligible sensitivity in the blue wavelength range (380-440 nm). Periodic resistance changes induced by irradiation at 700±10 nm of a 100 µm thick film of gel I (area 1 $cm^2$) placed between two glass/ITO electrodes are shown in FIG. 2A. The gel is a dielectric with conductivity $0.2 \times 10^{-6}$-$0.5 \times 10^{-6}$ S/cm and the photoinduced decrease of resistance lies within the range of 10-15%. Irradiation at 700 nm in the presence of the DC electric field also leads to an increase in the absorption in the far red (FIG. 2B) as compared to the non-treated gel, in which a low intensity absorption band, centered at 820 nm is visible in the spectrum (FIG. 2C). Absorption at ~700 nm is known for systems containing nitrogen oxides [11], but also in the presence of charge transfer interactions via hydrogen bonding [12]. Here, the charge transfer would occur between carboxylic acid groups and polymeric pyridine side chains. Intermolecular interaction between carboxylic acid and pyridyl groups was shown to be the driving force responsible for copolymer miscibility.

The effect of the light/DC field treatment on the P(4VP-BMA)/Py gel (I) is visible in $^1$H-NMR spectra (not shown). Narrow resonances in the region of the ethyl and methyl groups (0.9-2.0 ppm) assigned to protons of the monomer residues of the butyl chain disappeared. In addition, the intensity of the resonance of the methyl group hydrogen (peak ay 0.9 ppm) decreases. These results indicate that, due to hydrogen bonding, additional polymerization is occurring in the gel under irradiation/DC field. Glass transition (Tg) measurements also demonstrated the effect of the light/DC field treatment. In the untreated state, the P(4VP-BMA) gel is homogenous without displaying a glass transition in the 10-80° C. temperature range. However, after treatment, the P(4VP-BMA) gel revealed a clear glass transition at 40° C., confirming a strengthened hydrogen bond structure in the gel accompanied by additional polymerization.

Photoelectrical Properties of (P4VP)/P(4VP-BMA)/Py Gel Blend

Figure 3:
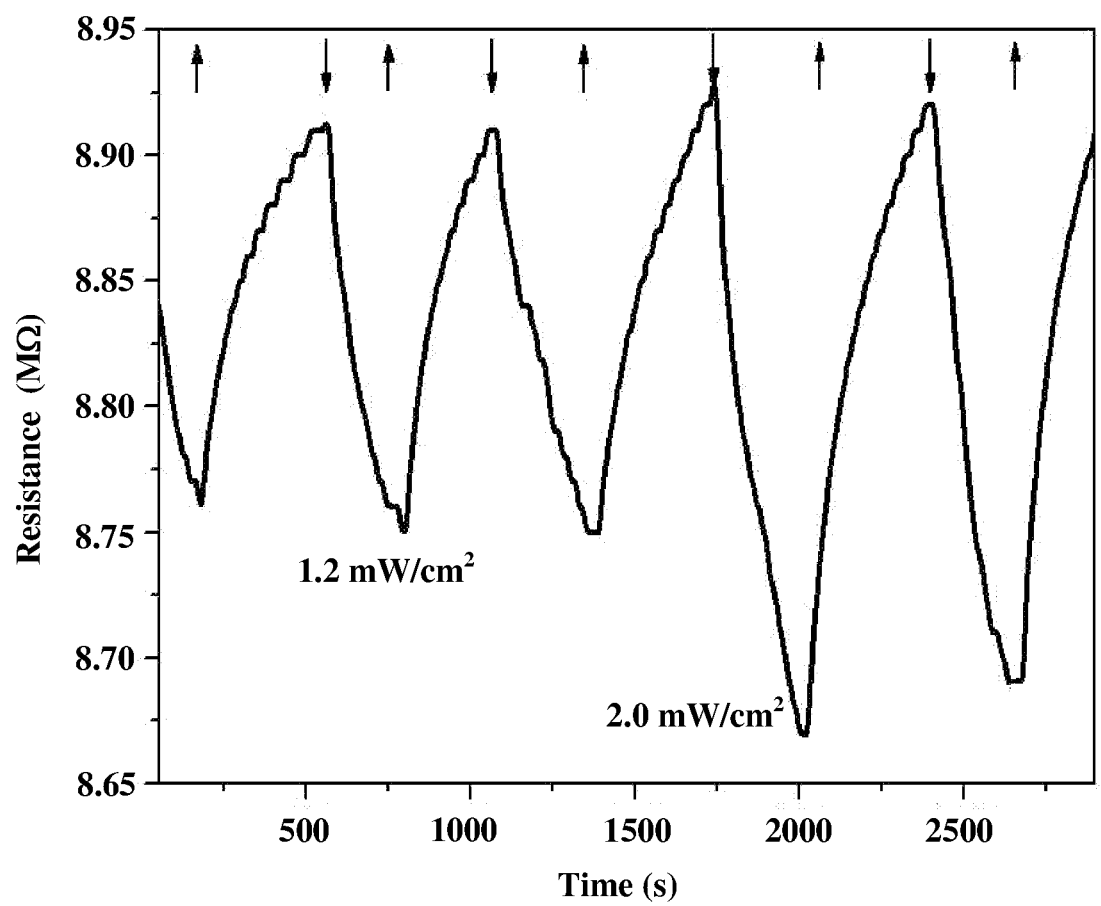
FIG. 3 shows the resistance changes of a 300 μm thick film of the P(4VP)/P(4VP-BMA)/Py gel (area 1 cm$^2$) placed between two plastic film/ITO electrodes. The white light source, producing two different intensities: 1.2 mW/cm$^2$ and 2.0 mW/cm$^2$ in the plane of the sample. Chopping was achieved with a manual shutter. The down pointing arrows indicate light on and the up pointing arrows, light off. The sample was placed under applied bias 3.7 V for two hours prior to the measurements. A thermocouple with accuracy of ±0.1° C. was used for temperature control. The temperature in the room of observation was stabilized at 22.5±0.1° C. ΔR/R for 1.2 mW/cm$^2$ and 2.0 mW/cm$^2$ was 1.8% and 2.8% respectively.

A 300 μm thick film of P(4VP)/P(4VP-BMA)/Py gel (area 1 cm$^2$) was placed between two plastic film/ITO electrodes and irradiated with white light as described in the Experimental section above. The internal DC electric field, applied at least 0.5 h prior to the beginning of the measurements exceeded 1 kV/cm. The photoconductive response of the gel is shown in FIG. 3. The temperature of observation was stabilized at 22.5±0.1° C. The radiation induced resistance changes were fully reversible. For this polymer composition, the response reached sensitivity (ΔR/R) of 1.8% and 2.8% for 1.2 mW/cm$^2$ and 2.0 mW/cm$^2$ respectively. In contrast to the P4VP/Py gel, which is primarily sensitive to UV light at 385±10 nm, and the P(4VP-BMA)/Py gel, which is preferentially sensitive to far red light at 700±10 nm, FIG. 3 demonstrates that the gel formed by blending the two polymers is sensitive to the whole range of visible light.

UV-Visible and Fluorescence Spectroscopy of the P(4VP)/P(4VP-BMA)/Py Gel.

Figure 4:
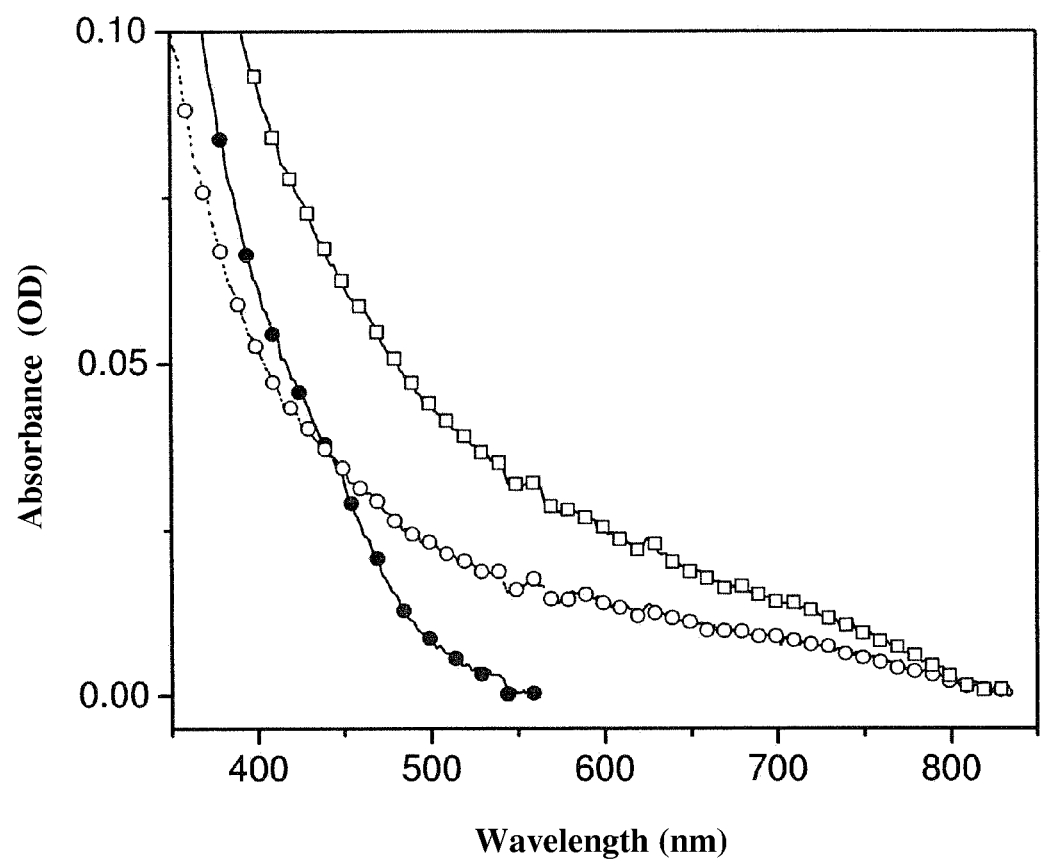
FIG. 4 shows the absorption spectra of 100 μm thick films of P4VP/Py (filled circles); P(4VP-BMA)/P4VPy/Py gel (II) polymer ratio 1:4 (open circles); P(4VP-BMA)/P4P/Py gel (III) polymer ratio 1:1 (open cubes).
Figure 5:
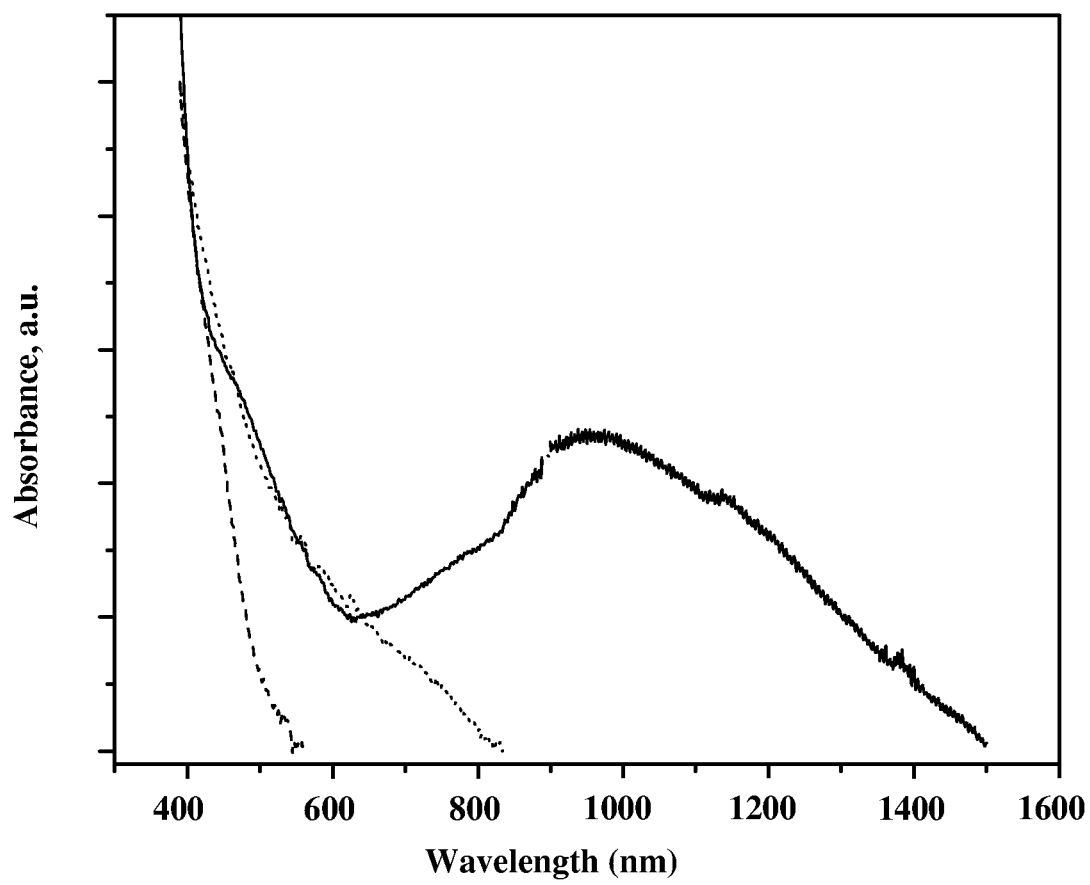
FIG. 5 shows the normalized UV-visible absorption spectra of a 1:1 molar ratio P(4VP)/Py gel (dashed line); the P(4VP)/P(4VP-BMA)/Py gel, prepared as described above (dotted line); and the same film after being kept under 3.7V DC bias during two hours (bold line). The 300 μm thick gel layers were sandwiched between two ITO coated glass slides.

A comparison of the UV-visible absorption spectra of P(4VP)/Py gel and the gels formed from the polymer blend of the invention, prepared as described in the Experimental section, is presented in FIGS. 4-5.

The tail of the absorption spectrum of the P(4VP)/Py gel reaches ~550 nm, while both gel II and gel III display an absorption tail extending throughout the whole visible range until approximately 870 nm. When a DC bias is applied to the gel blend II for one hour, a new broad absorption band centered at ~1000 nm appeared.

The absorption intensity in the visible range increases with increasing amounts of P(4VP-BMA). In contrast to the P4VP/Py gel, which is primarily sensitive to UV light at 385±10 nm, and the P(4VP-BMA)/Py gel, which is preferentially sensitive to far red light at 700±10 nm, the gels formed by blending two polymers are sensitive to the whole visible range. As a result, photoresistance changes can be detected under irradiation by white light (color temperature 2850K, intensity 21 mW/cm$^2$). The resistance decrease was 20% for gel II and 30-35% for gel III as compared to the dark state.

Figure 6:
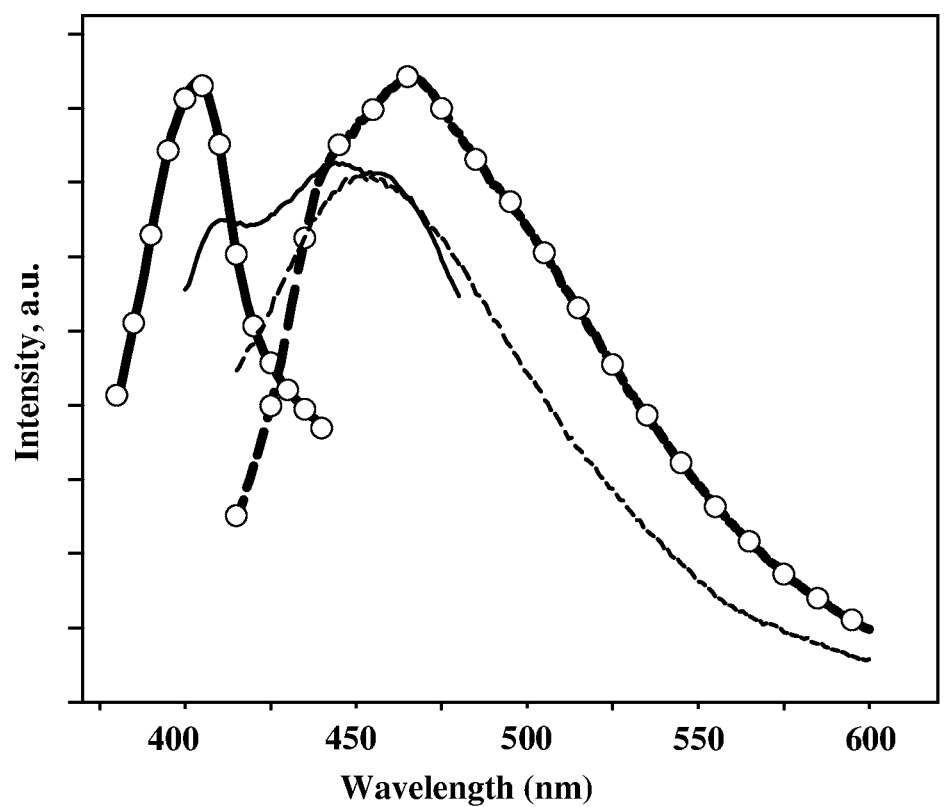
FIG. 6 shows excitation (left, solid plots) and emission (right, dashed plots) spectra of the P(4VP)/P(4VP-BMA)/Py gel (300 μm) on a glass/ITO substrate prior to application of the DC bias (plots without circles) and in the presence of the 3.7V DC bias (plots with circles).

Emission and excitation spectra of the polymer blend gel II are presented in FIG. 6. The spectra have weak similarity to the excitation and emission spectra of a P(4VP)/Py gel, which displays emission at 440 nm by excitation at 385 nm; emission at 504 nm by excitation at 440 nm; and emission at 525 nm by excitation at 460 nm [4]. However, in contrast to P(4VP)/Py gel, the polymer blend gel of the invention displays two maxima in the excitation spectra: at 405 nm and at 440 nm, with a single emission peak at 460 nm. Significant changes were observed in both the emission and excitation spectra of the gel blend when measurements were conducted under applied DC bias. A single high intensity, narrow excitation peak at 405 nm appeared, with emission maximum at 460 nm.

Figure 7A:
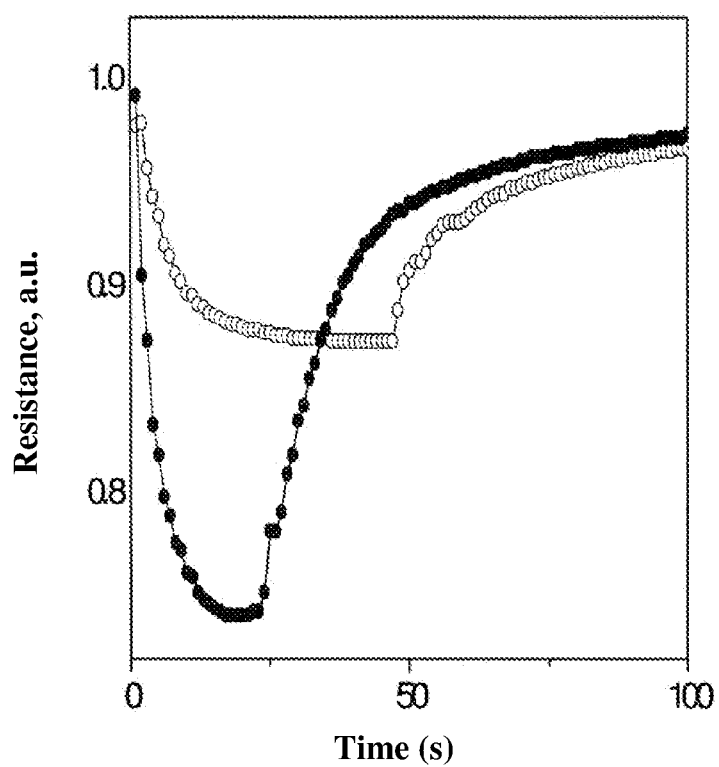
FIG. 7A-7C show resistance changes of 100 μm thick films of P(4VP-BMA)/P4VP/Py gel (III, curves with open circles) and the complex gel P4VP/Py and P(4VP-BMA)//Py gel (V, curves with closed circles). Irradiation at 380±10 nm (FIG. 7A), 400±10 nm (FIG. 7B) and 700±10 nm (FIG. 7C) was accomplished with a Xe lamp with power at 380 nm-5.3 mW/cm$^2$, 400 nm-10.1 mW/cm$^2$, 700 nm-6.7 mW/cm$^2$. Pulse duration was 20-30 sec. The internal DC electric field exceeded 1 kV/cm. The temperature of the observation was stabilized at 22.5±0.1° C.
Figure 7B:
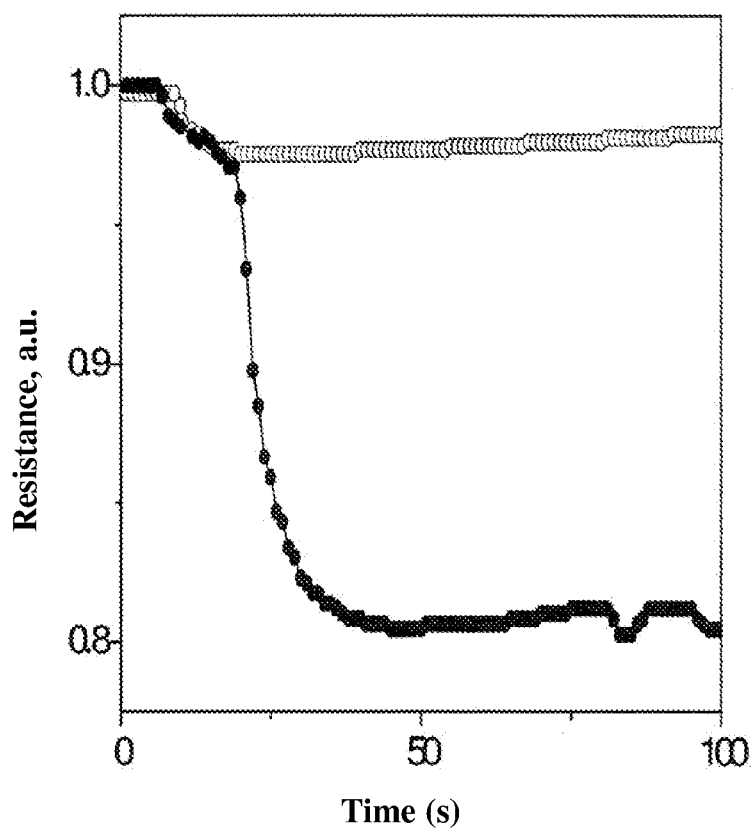
Figure 7C:
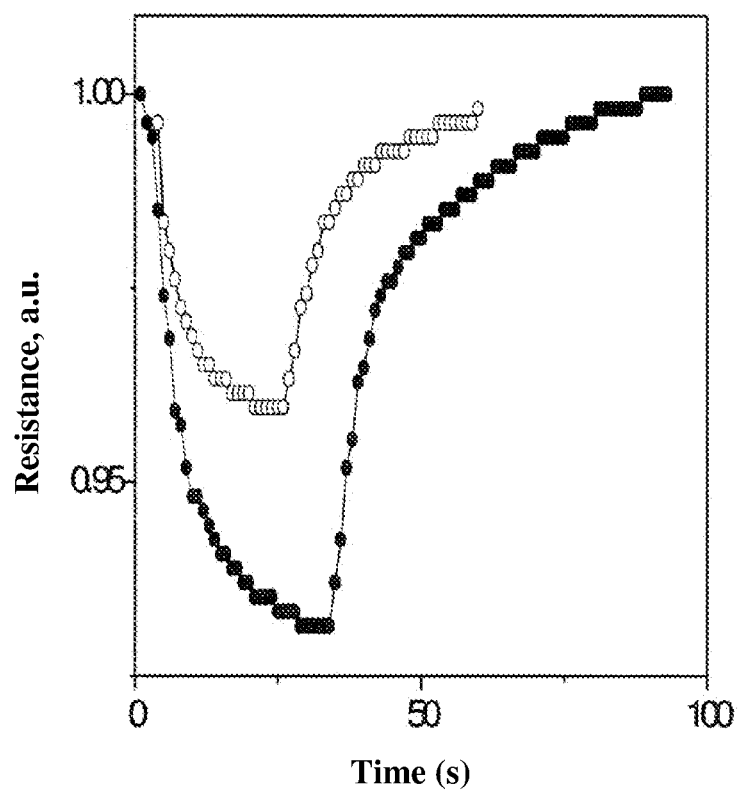

To analyze the photochemical process, measurements of the photo-response of gel III at three different wavelengths were carried out: 380 nm, 400 nm and 700 nm. The photo-response of the gel to a 20-30 sec pulse of radiation at the three different wavelengths is presented in FIGS. 7A-7C (curves with the open circles). On the same graphs, the photo-response of the complex gel V (curves with closed circles) is presented. Although gel III is optimal among the blends, the response of the complex V is more marked than that of gel III in all three wavelengths.

Comparison of the photoinduced resistance decay of gels P4VP/Py, I, II, III and IV at the three different wavelengths is provided in Table 1 below. The comparison was made by fitting the photoinduced decrease of the resistivity, for irradiation at 380 nm the photoinduced resistivity decrease could be fitted as a first order exponential decay; at 400 nm, a second order exponential decay; and at 700 nm, a first order exponential decay, according to equation (1):

$$R_t = R_0 \times \exp(-t/\tau) \quad \text{(eq. 1)}$$

where $R_t$ and $R_0$ are values of the resistance at times t and 0 respectively; τ is the time constant of the process.

TABLE 1

| | | photoinduced resistance decay | | |
|---|---|---|---|---|
| % weight P(4VP-BMA) | % weight P4VP | Time constant, τ (s) λ = 380 ± 10 nm | Time constant, τ (s) λ = 400 ± 10 nm | Time constant, τ (s) λ = 700 ± 10 nm |
| 0 | 100 | 4.8 | 2.54 | — |
| 10 | 90 | 5.8 | 5.23 | — |
| 20 | 80 | 4.3 | 7.2 | 4.1 |
| 50 | 50 | 3.06 | 3.7 | 6.3 |
| 100 | 0 | — | — | 7.6 |

The rate constant of the photochemical reaction at 380 nm decreases with increase in the relative amount of P(4VP-BMA), in contrast to what occurs at 700 nm. There, the rate constant of the process increases with increasing amounts of P(4VP-BMA) and at 400 nm the first (and shorter) time constant has a maximum at a concentration of 20% P(4VP-BMA). Without wishing to be bound by theory, this data suggests that two different mechanisms may be involved in the photoinduced conductivity of the blended polymer gel: a reversible interaction at an excited electron transfer $R_xNH^+$—$R_yCOO^-$ (FIG. 9, as will be further discussed below), while the other is most probably bimolecular excited state reaction: $(RN^+—H)^* \rightarrow (RN).+H^+$.

The dominant mechanism of proton transfer involves a hopping process, the rate depending on the charge transfer integral and also on the reorganization energy due to geometrical relaxation. Thus, a reasonable assumption will be that in the P(4VP-BMA) gel, interactions of carboxylic groups with the pyridinic nitrogen said-chain do occur. Under irradiation at 700 nm in the presence of the DC electric field, the maximum of the absorption of the electron transfer complex is long wavelength shifted (to 950 nm) and the intensity of the absorption increases with the duration of the light/DC field treatment due to an increase in the hydrogen bonding strength.

Effect of a DC Bias on FTIR Spectra of (P4VP)/P(4VP-BMA)/Py Gel

Figure 8A:
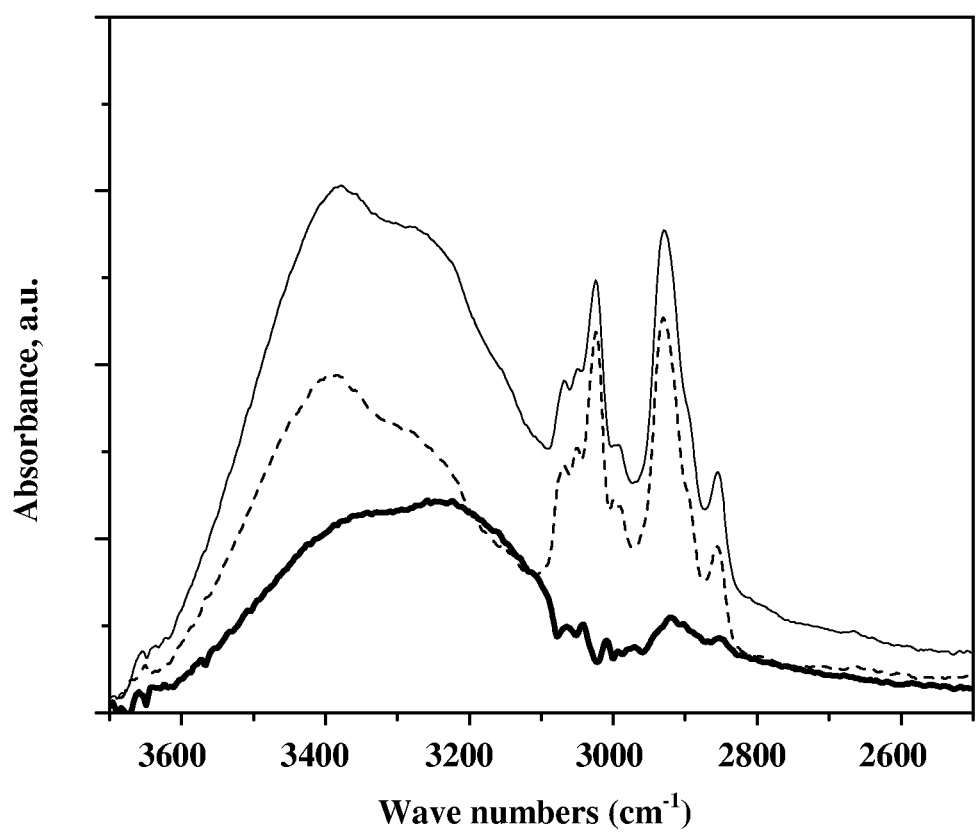
FIGS. 8A-8C show FTIR spectra of a free standing thin film (10 μm) of the P(4VP)/P(4VP-BMA)/Py gel before (dashed curve) and after application of DC bias (2 hours, internal field about 1 kV/cm) (thin solid curve) in the frequency range characteristic of hydrogen bonded hydroxyl and NH groups (FIG. 8A) and in the frequency range of the fundamental vibrations of the pyridine ring (FIG. 8B) and in the range of the C=O stretching vibration (FIG. 8C). The thick solid line is the difference spectrum before and after application of the DC field.
Figure 8B:
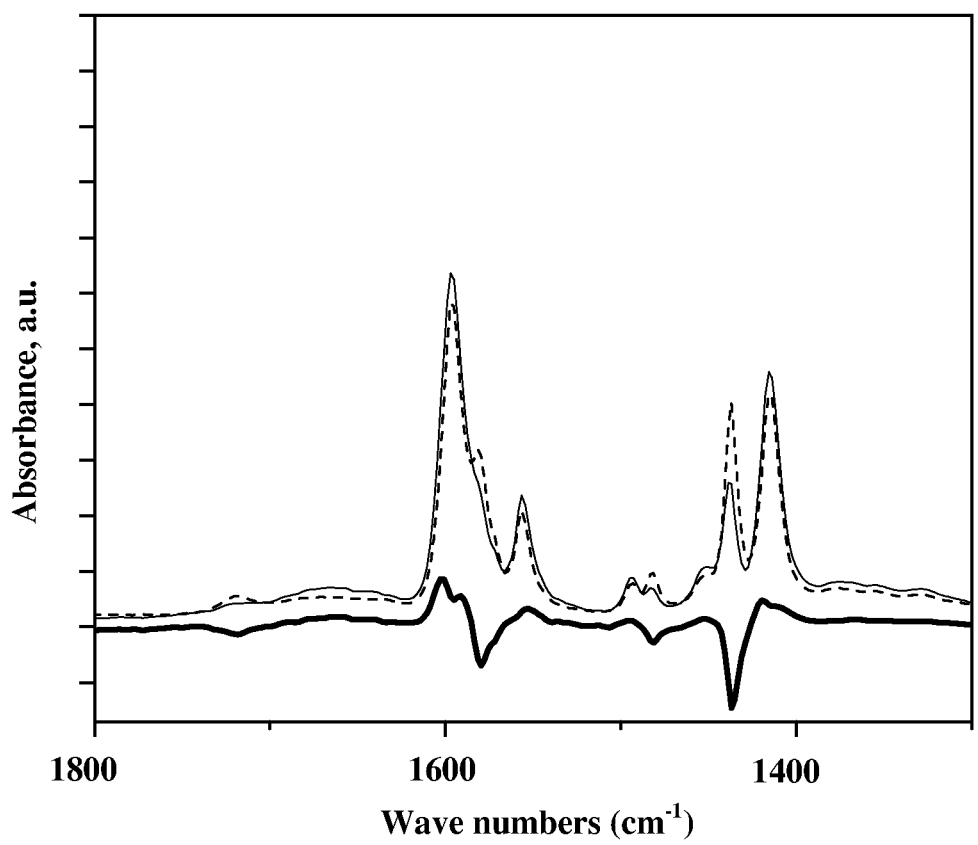
Figure 8C:
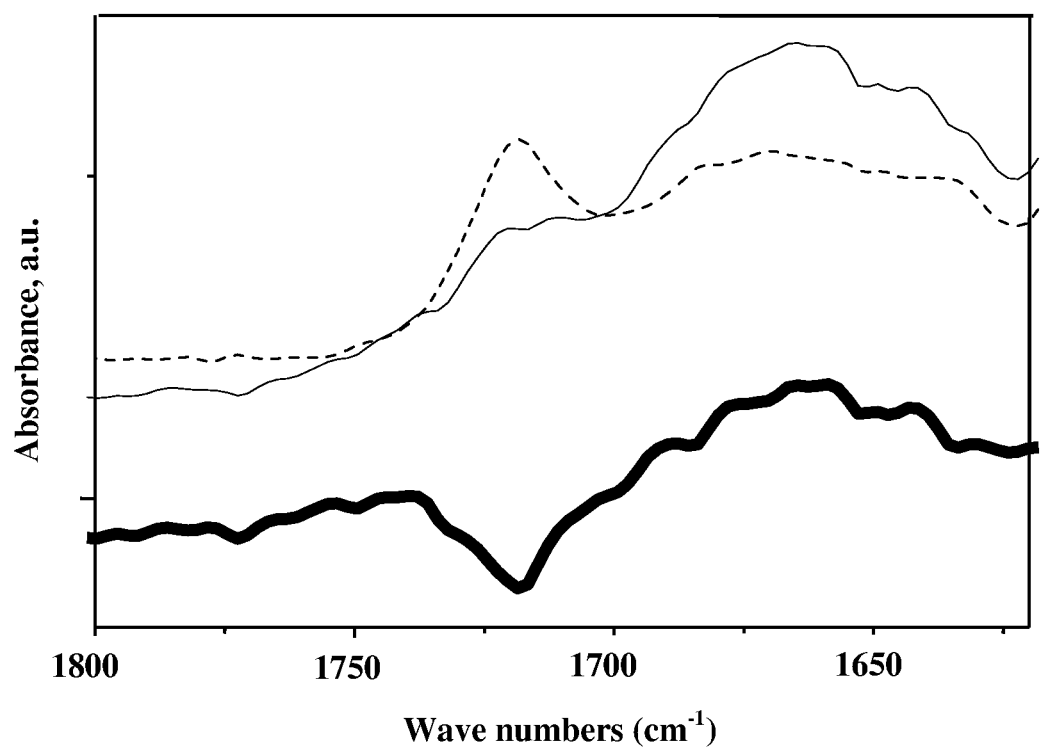

FTIR spectrum measurements of the gel were conducted before and after applying a DC bias of ~1 kV/cm for 2 hours. The most pronounced changes occurred in the wavelength region sensitive to hydrogen bonded hydroxyl and NH groups (3600-3000 $cm^{-1}$) ((FIG. 8A), in the region of the fundamental vibrations of the pyridine ring and the C=O carbonyl stretching vibration (FIG. 8B). The spectra show an increase in intensity of the broad peaks at 3367 $cm^{-1}$ (N—H stretching vibration) and 3262 $cm^{-1}$ (O—H stretch) [13,14]. Marked changes also occurred in the region of the C=O stretching vibration due to the DC bias: the intensity of absorption at 1720 $cm^{-1}$ was significantly reduced, and a high intensity broad absorption at 1680 $cm^{-1}$ appeared instead (FIG. 8C). Absorption at 1680 $cm^{-1}$ is known to be due to vibration of the ionized form of C=O [15]. The sharp peaks due to the distortional vibrations of the pyridine ring at ~1440 $cm^{-1}$ (semicircle stretch) and 1580 $cm^{-1}$ (quadrant ring stretch) are reduced in intensity after application of the field.

DFT Modeling

Figure 9:
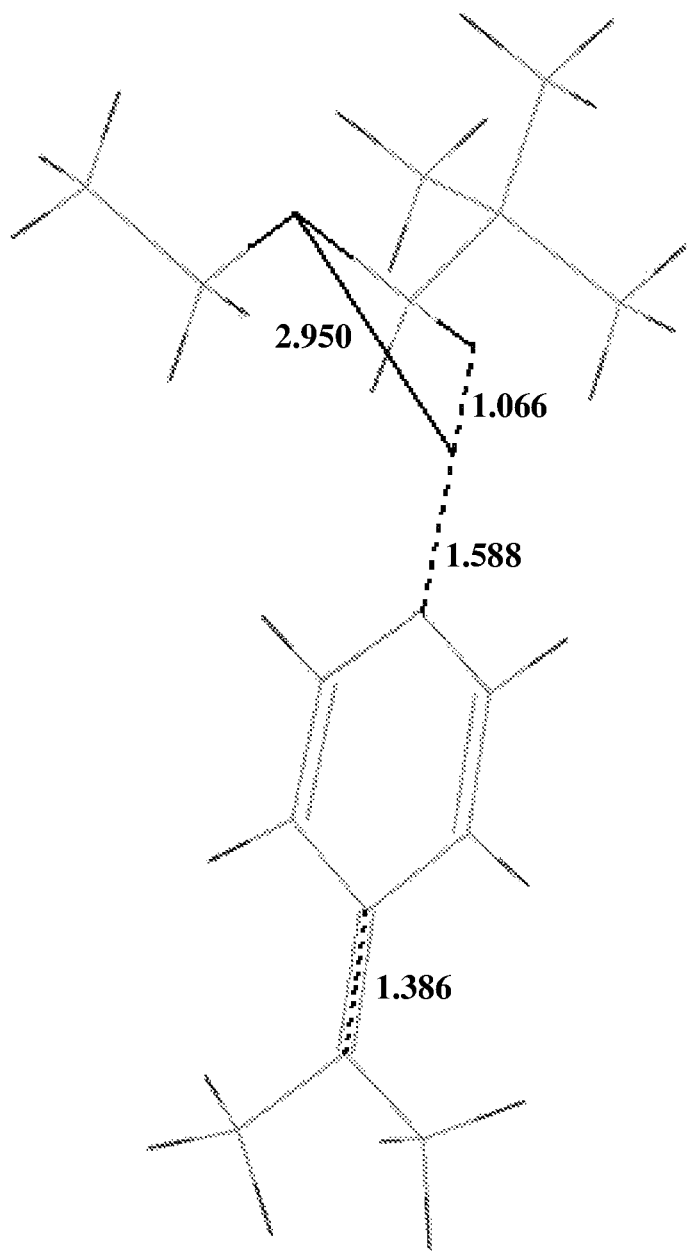
FIG. 9 shows a DFT-optimized hydrogen bonded dimer of the side chains of 4-vinyl pyridine and butyl methacrylate; significant distances are marked with green color.

The energy optimized geometry of a hydrogen bonded heterodimer between a pyridine side-chain and a butyl methacrylate side-chain is shown in FIG. 9. The C—C double bond between the polymer main chain and the pyridine ring is relatively short 1.386 Å, and is evidence for conjugation. The nitrogen atom is protonated with N—H distance of 1.538 Å. Continuing to the butyl methacrylate side-chain, the distance from the proton to the oxygen atom is 1.066 Å, which, without wishing to be bound by theory, suggests that this interaction is more similar to covalent bonding than to hydrogen bonding. There are indications from DFT modeling that, in principle, very strong DC fields are able to shift the position of the proton in the N—H interacting group.

Thermoelectrical Properties of the P(4VP)/P(4VP-BMA)/Py Gel Blend

Figure 10:
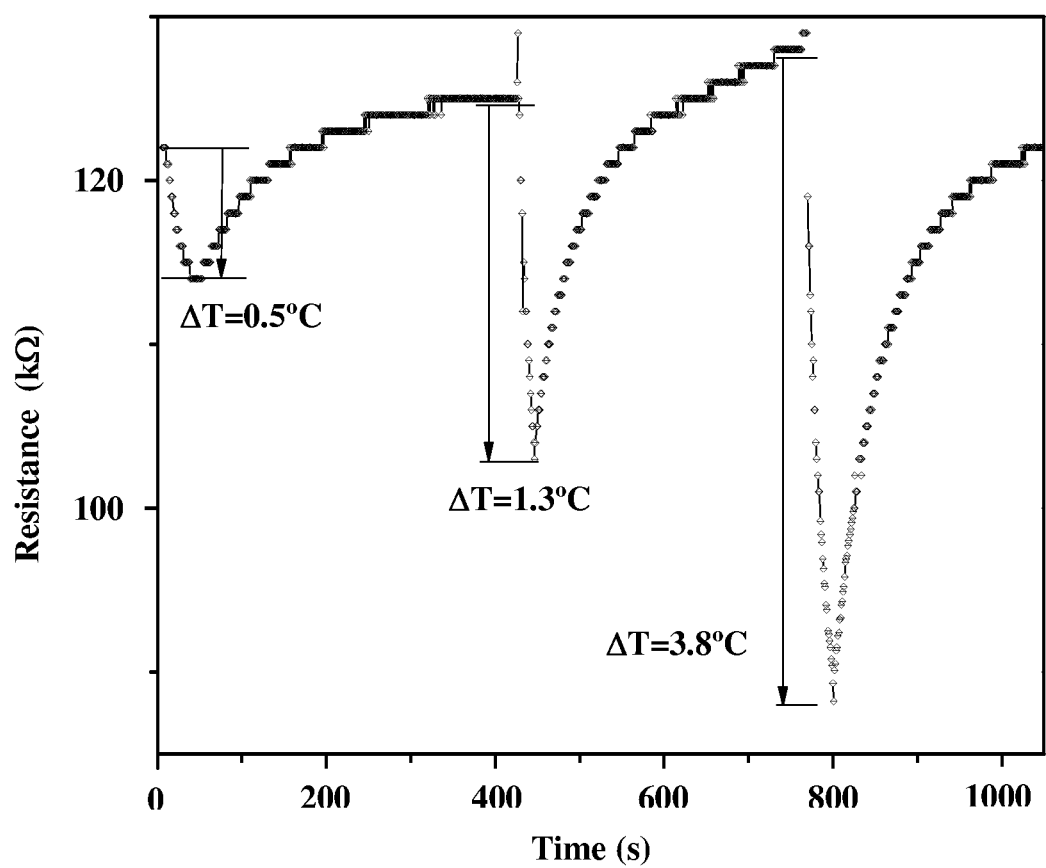
FIG. 10 shows the change of resistance upon heating of a 200 μm thick layer of the P4VP/P(4VP-BMA) gel placed between two ITO-coated plastic substrates. Bias voltage of 3.7V was applied, beginning 0.5 hr prior to resistance measurements. A T-type thermocouple with accuracy 0.1° C. was placed on the electrode surface and used for temperature control. The first two curves were produced by the approach of a student's hand at two different distances from the gel sample: 20 cm and 5 cm. The third curve was produced by breathing on the sample. In each case, the heating lasted for ~5 s. The room temperature was stabilized at 22.5±0.1° C.

A small amount of 4-hydroxypyridine was added to the P(4VP)/P(4VP-BMA)/Py gel blend having the ration 20:80. A 300 μm thick layer of the gel blend was placed between two plastic/ITO electrodes and kept under bias of 3.7V DC (internal field>1 kV/cm) during at least 0.5 hour. The area of the gel sample was 1 $cm^2$. Resistance measurements show that the gel behaves as a thermo-responsive material. The response of the gel to a varying heat source is presented in FIG. 10. The response is completely reversible and the sensitivity is $\Delta R/R \sim 6\text{-}16\%/1°C$. The decay time of the response is 2-5 sec.

The electrical conductivity of the P(4VP)/P(4VP-BMA)/Py gel blend described herein is sensitive to both irradiation by white light and, with the addition of 4-hydroxypyridine, to thermal perturbation. The light sensitivities of gels prepared from the individual polymers are very different as noted above. The photosensitivity of the gel blend is observed following extended application of a DC bias (internal electric field ~1 kV/cm). The resistance of the gel under bias increases with time: the initial resistance of a 100 μm thick film is approximately 1-3 Mohm (MΩ), whereas in the saturated state (achieved after a minimum of 0.5 hr) the resistance reaches 6-7 Mohm.

Spectroscopic techniques were used to probe the nature of the structural changes within the gel blend which occur in the presence of the electric field and which may account, in part, for its marked radiation sensitivity.

At the level of interacting molecular groups, the C=O of the butyl methacrylate side-chain shows a population shift from neutral to ionic species in the infrared, which follows application of bias. The ionized state of the oxygen atom in the C=O group is visible through changes in the characteristic stretching vibration of "free" carbonyl [15], originally at 1722 $cm^{-1}$. In addition, the red-shift of the carbonyl stretching vibration is evidence of hydrogen bonding with adjacent groups. The broad and intense vibration centered at ~1663 $cm^{-1}$ can be assigned to ionized carbonyl groups acting with different strength proton donors. With respect to the pyridine side chain, the increase in the broad asymmetric absorption band at 3400 $cm^{-1}$ (width 259 $cm^{-1}$) indicates increased formation of pyridinium ions [13] on the polymer side chains. A decrease in the vibrational intensity of the distortion modes of the pyridine ring is also observed.

Based on the spectroscopic data and DFT modeling presented herein, a picture of the polymer gel blend emerges. The effect of the electric field on the preformed, hydrogen-bonded P(4VP)/P(4VP-BMA)/Py gel results in the formation of additional pyridinium groups; additional hydrogen bonded and ionic interactions between pyridine side-chains and between pyridine and butyl methacrylate side-chains. In addition, the electric field contributes to structural reorganization and macroscopic ordering, while at the same time increasing the gel electrical resistance to a saturation value.

Figure 11:
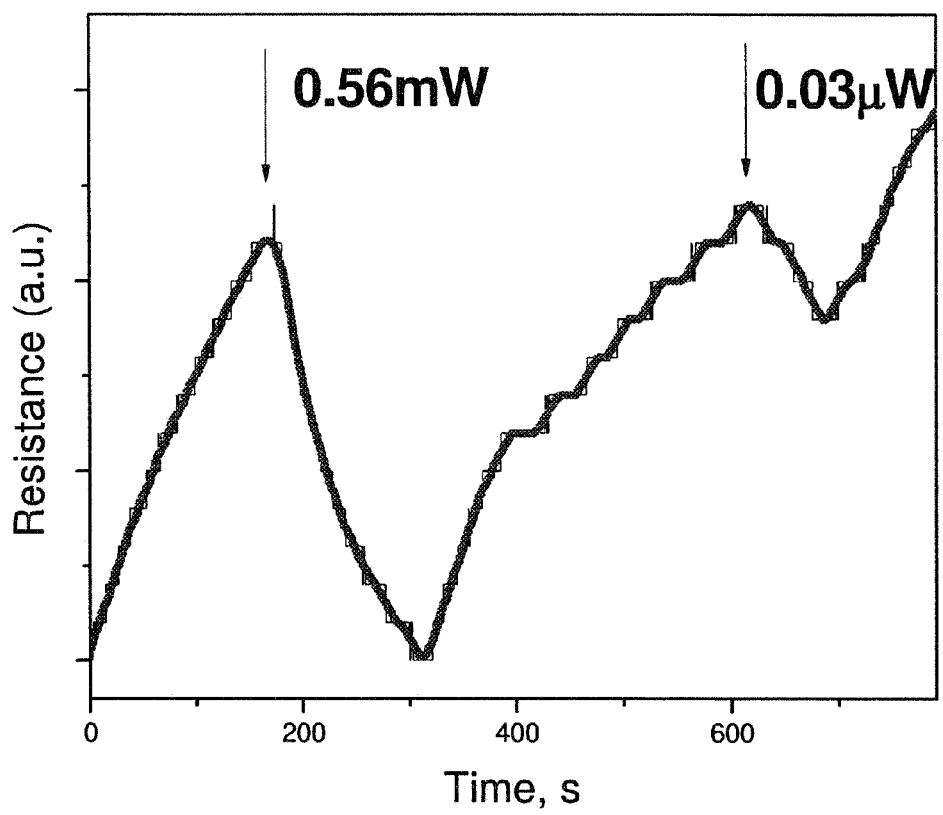
FIG. 11 shows the resistance changes of 10 μm thick films of the P(4VP-BMA)/P4VP gel (II) prepared on two glass/ITO electrodes, interrupted irradiation with the white light is represented by the arrows, at two different intensities. The source of light was a lamp (KT-2.2V, 0.47 A) (0.56 mW) and scattered low intensity sun light in the dark room (0.03 μW).

Photoelectrical Properties of (P4VP)/P(4VP-BMA)/Py Gel Blend in Improved Adhesion Systems Experiments for improvement of the adhesion of gel II on ITO electrodes surfaces were also conducted. The adsorption of the thin layer of the carboxylic acid on the ITO surface was shown to form significantly improved adhesion. Results of photoconductivity measurements of such a system are given in FIG. 11. As shown in FIG. 11, photosensitivity of the system was significantly improved: white light with intensity (0.56 mW) and even much lower intensity (0.03 μW), caused the resistance change of the system.

Figure 12:
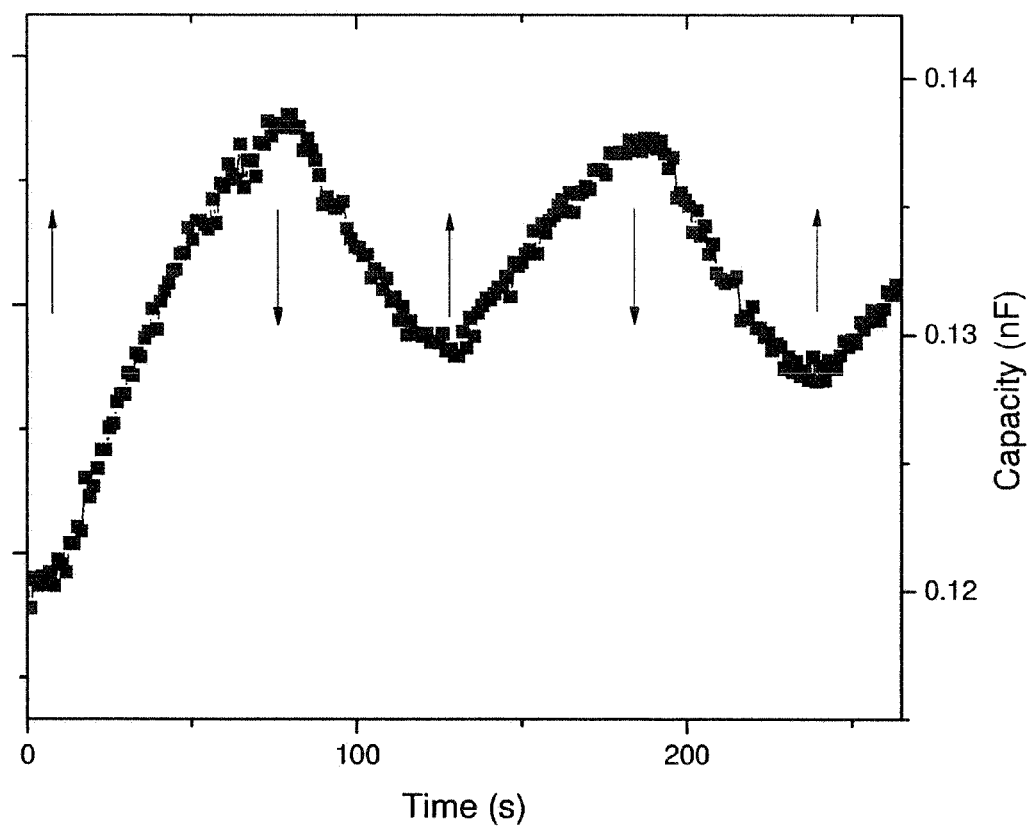
FIG. 12 shows the capacitance change of 100 μm thick films of the P(4VP-BMA)/P4VP gel (II) prepared on two glass/ITO electrodes and Fe3O4 nanoparticles as an intermediate layer. Interrupted irradiation with the white light (2800 K, 5 mW intensity) every 60 seconds is represented by the arrow: the arrow pointing up refers to light "on", and the arrows pointing down refer to light "off". The electrical complex impedance was measured by Keithley model SCS-4200 semiconductor characterization system using CVU-capacity-voltage unit. The measurements were taken at voltage frequency of 5 kHz and amplitude of 30 mV applying bias DC voltage of 4.5 V.

Influence of Doping on the Photoelectrical Properties of (P4VP)/P(4VP-BMA)/Py Gels The P(4VP)/P(4VP-BMA)/Py gels demonstrated unusual properties of capacity changes, when gel doped with nanoparticles of $Fe_3O_4$ (iron (II,III) oxide, nanopowder ~50 nm, >98% trace metals basis, Aldrich), as can be seen in FIG. 12. The capacitance $C_s$ and resistance $R_s$ had been evaluated by considering the complex impedance Z as a serial connected capacitive reactance with active resistance: $Z=R_s+1/(j\omega C_s)$ (ω is an angular frequency of applied voltage). Interrupted irradiation with the white light (5 mW intensity) every 60 seconds is presented by arrows. As can be seen, the capacity changed periodically following the periodicity of the white light interruption.

The invention claimed is:

1. A composition, comprising: poly(4-vinyl pyridine); poly (4-vinyl pyridine-co-butyl methacrylate); pyridine; and 4-hydroxypyridine.

2. The composition of claim 1, wherein the weight ratio of poly(4-vinyl pyridine) to poly(4-vinyl pyridine-co-butyl methacrylate) is between 90:10 and 50:50.

3. The composition of claim 1, wherein the composition is photo-sensitive and thermo-sensitive.

4. The composition of claim 1, having an electrical conductivity of at most $10^{-8}$ S/cm.

5. The composition of claim 4, wherein the electrical conductivity of the composition is at least $10^{-3}$ S/cm during exposure to light.

6. The composition of claim 5, wherein said light is selected from the group consisting of light having a wavelength of from between 254 and 14,000 nm, light having a wavelength of from between 400 and 750 nm, and white light.

7. A photo-sensitive material, comprising: poly(4-vinyl pyridine); poly(4-vinyl pyridine-co-butyl methacrylate); 4-hydroxypyridine; and optionally pyridine.

8. A thermo-sensitive material, comprising: poly(4-vinyl pyridine); poly(4-vinyl pyridine-co-butyl methacrylate); 4-hydroxypyridine; and optionally pyridine.

9. A device, comprising: the composition of claim 1.

10. The device of claim 9, being selected from the group consisting of a photo-responsive panel, a photovoltaic cell, a photo-responsive sensor, a thermo-responsive sensor, a thermal resistor, a thermo-responsive panel, a liquid display panel, and an external controlled capacitor.

11. A thermo-sensitive sensor and/or a photo-responsive sensor, comprising:
the composition of claim 1.

12. A thermo-responsive panel, comprising:
the composition of claim 1.

13. A device, comprising:
a sensor element, the sensor element comprising
the photo-sensitive material of claim 7, and
at least one electrode or electrodes assembly and wiring.

14. The device according to claim 13, wherein the device is a thermo-sensitive sensor for use in a thermal imaging device.

15. The device according to claim 14, wherein the thermal imaging device is a night-vision device.

16. The device according to claim 13, wherein the device is a thermo-responsive panel, for use in a touch-screen device.

17. The device according to claim 13, wherein the device is a photo-responsive sensor, or a photo-detector, selected from a charged-coupled device (CCD), a photoresistor, a photovoltaic cell, a photomultiplier, and a phototransistor.

18. A thermal imaging device, comprising: the thermo-sensitive sensor according to claim 11, an image intensifying element, and optionally one or more of a telescopic lens and an IR illuminator.

19. A touch-screen device, comprising: the thermo-sensitive sensor according to claim 11, said sensor being formed as a layer of material beneath a top layer of a user-interface screen, for providing a panel responsive to local changes in temperature resulting from heat transfer between a finger of a user and the thermo-sensitive material.

* * * * *